United States Patent [19]
Iwase

[11] Patent Number: 6,034,982
[45] Date of Patent: Mar. 7, 2000

[54] SEMICONDUCTOR LASER ARRAY

[75] Inventor: Masayuki Iwase, Tokyo, Japan

[73] Assignee: The Furukawa Electric Co., Tokyo, Japan

[21] Appl. No.: 08/905,645

[22] Filed: Aug. 4, 1997

[30] Foreign Application Priority Data

Aug. 6, 1996 [JP] Japan .................................. 8-223110

[51] Int. Cl.⁷ .............................. H01S 3/19; H01S 3/00; H01L 21/20
[52] U.S. Cl. ................................ 372/50; 372/46; 372/38; 438/28
[58] Field of Search .................................. 372/36, 50, 46; 438/26–28, 34, 47

[56] References Cited

U.S. PATENT DOCUMENTS

| | | |
|---|---|---|
| 3,794,883 | 2/1974 | Bylander et al. . |
| 4,079,404 | 3/1978 | Comerford et al. . |
| 4,916,710 | 4/1990 | Hattori . |

FOREIGN PATENT DOCUMENTS

| | | |
|---|---|---|
| 0 457 344 | 11/1991 | European Pat. Off. . |
| 0 466 134 | 1/1992 | European Pat. Off. . |
| 39 19 462 | 12/1989 | Germany . |
| 63- 31104 | 3/1988 | Japan . |

OTHER PUBLICATIONS

Ying Jay Yang et al. "Submilliampere continuous–wave room–temperature lasing operation of a GaAs mushroom structure surface–emitting laser" Applied Physics Letters, vol. 56, No. 19, May 7, 1990, New York, pp. 1839–1840, XP000149893.

*Primary Examiner*—Rodney Bovernick
*Assistant Examiner*—Quyen Phan Leung
*Attorney, Agent, or Firm*—Helfgott & Karas, P C.

[57] ABSTRACT

A semiconductor laser array has an array of a plurality of laser active sections mounted on a submount, with a common p-side electrode sandwiched therebetween. The laser active sections formed on a semiconductor substrate and separated from each other by separation channels are bonded onto the common p-side electrode in a junction-down fashion wherein the top layer of the laser active sections are bonded to the common p-side electrode. The semiconductor substrate are polished at the back surface for separation of the laser active sections from each other, followed by forming an n-side electrode for each of the laser active sections. The semiconductor laser array can be formed in a uniform thickness and can be driven by N-P-N transistor at a high speed.

6 Claims, 3 Drawing Sheets

SEMICONDUCTOR LASER ARRAY

BACKGROUND OF THE INVENTION

1. Field of the Invention

The present invention relates to a semiconductor laser array used as an optical interconnection in an optical communication system or in an information processing system. The present invention also relates to a method for manufacturing such a semiconductor laser array.

2. Description of the Related Art

Recently, an optical interconnection using an optical parallel link system attracts special attention in the field of optical transmission systems between communication channels for computers or the field of ATM exchange systems. A semiconductor laser array or photodetector array for use in such a field is considered as a key device of the optical parallel link system.

Since the semiconductor laser array requires a high-speed operation, NPN transistors which generally operate at a high-speed are used in a drive circuit for driving the semiconductor laser array. For the drive circuit using NPN transistors, a semiconductor laser array having a p-type common electrode is generally used.

FIG. 1 shows a conventional semiconductor laser array including a plurality of semiconductor laser arrays, and FIG. 2 shows the detailed cross-section of the semiconductor laser array of FIG. 1. Referring first to FIG. 1, the semiconductor laser array generally designated at numeral 50 includes a plurality of semiconductor laser devices 52 electrically separated from each other by separation channels 54 to operate independently of each other. The plurality of laser devices 52 are mounted in a junction-up fashion on a common metallic carrier (not shown) with an intervention of a submount 56 disposed between the laser devices and the metallic carrier. An n-side electrode 58 is formed on top of each separate laser device 52, whereas a p-side electrode 60 is formed on the submount 56 as a common electrode layer for the laser devices 52.

Referring next to FIG. 2, the laser active section of each semiconductor laser device comprises a p-type InP (p-InP) cladding layer 64, a strained multiple quantum well (MQW) active layer 66 and an n-InP cladding layer 68 consecutively formed on a p-InP substrate 62. The laser active section is buried by a p-InP burying layer 70, an n-InP blocking layer 72 and a p-InP blocking layer 74, which are consecutively grown on the p-InP substrate 62, at both sides of the laser active section. On the top of the laser active section, there is provided a p-InP contact layer 76, on which a passivation layer 78 is formed over the entire surface except for the n-side electrode 58. The length (L) of the laser active section of each laser device 52 is 200 $\mu$m and the pitch (P) of the laser devices 52 in the array is 250 $\mu$m, for example. A reflective film having a reflectance of 90% or above is formed on both the facets of the laser device 52.

Before operation, the semiconductor laser array 50 of FIG. 1 is optically connected to a plurality of optical fibers corresponding to the semiconductor laser devices 52. The optical fibers are fixed to the respective laser devices at the locations wherein a maximum coupling efficiency can be obtained. Specifically, the optical fibers are generally fixed to respective portions of a metallic package receiving the semiconductor laser array.

The conventional semiconductor laser array as described above has disadvantages as follows:

It is difficult to epitaxially grow the n-InP blocking layer 72 in the vicinity of the n-InP cladding layer 68 and yet electrically separated from the n-InP cladding layer 68 to obtain a current blocking structure of the laser active section. The current blocking structure is essential to the buried heterojunction (BH) structure of the semiconductor lasers wherein the laser devices 52 operating independently of each other are formed on a p-type substrate from the view point of lower power dissipation and thus have a lower threshold. Moreover, it is difficult to control the process for obtaining stable laser characteristics by, for example, preventing the Zn ions used as a p-type dopant in the p-type substrate from re-diffusing to the laser active section during the epitaxial growth step to vary the laser characteristics.

In the semiconductor laser device, the length of the laser active section should be limited to 200 $\mu$m or less for obtaining a low threshold current, and a high reflectance film should be formed on both facets of the laser device to decrease the mirror loss. However, in a laser device having a small length at the laser active section, as is the case of the conventional laser array of FIG. 1, the resin of the high reflectance film flows and attaches to the surface of the electrode during a manufacturing step thereof, thereby impeding a bonding step for the electrode layer.

The thickness of the laser devices generally varies as viewed along the direction of the array in the conventional semiconductor laser array wherein the laser devices are mounted on the carrier with the intervention of the submount. Accordingly, the core center of each optical fiber must be adjusted to the lasing center of the active layers for an efficient optical coupling one by one. If the thickness of the substrate could be controlled in a submicron order, the adjustment might be well effected at a sufficient level. However, it is difficult to attain such an accuracy in the thickness of the substrate even by using a polishing and grinding step for the substrate.

SUMMARY OF THE INVENTION

It is therefore an object of the present invention to provide a semiconductor laser array wherein the epitaxial growth of the layers of the laser active section and forming of the high reflectance layer can be well controlled to obtain an efficient coupling of the laser active sections with optical fibers.

It is another object of the present invention to provide a method for manufacturing the semiconductor laser array mentioned above.

The present invention provides a semiconductor laser array comprising a submount, a common electrode layer formed on the submount, and an array of a plurality of laser active sections bonded onto the common electrode layer in a junction-down structure, the laser active sections being electrically separated from each other and each having a laser active layer and an opposing electrode overlying the laser active layer.

The present invention also provides a method for forming a semiconductor laser array comprising the steps of forming an array of a plurality of laser active sections on a semiconductor substrate, bonding the array of laser active sections onto a common electrode formed on a submount so that a top of each of the laser active sections being in contact with the common electrode, polishing the array of laser active sections at a back surface of the semiconductor substrate, and forming an opposing electrode on each of the bottoms of the laser active sections.

In accordance with the present invention, the junction-down structure in bonding the laser active sections to the submount provides a uniform thickness of the laser active sections to thereby allow the lasing centers of the laser active sections to be aligned with respective optical fibers with ease. It is preferable that the common electrode is a p-side electrode and the opposing electrode is an n-side electrode for allowing N-P-N transistors to drive the laser active sections.

Moreover, a high reflectance resin film attached to the electrode by flowing of the resin can be removed by the polishing step. Thus, bonding of the laser active sections at the electrodes can be effectively conducted.

The above and other objects, features and advantages of the present invention will be more apparent from the following description, referring to the accompanying drawings.

PREFERRED EMBODIMENTS OF THE INVENTION

Now, the present invention is more specifically described with reference to accompanying drawings.

Figure 1:
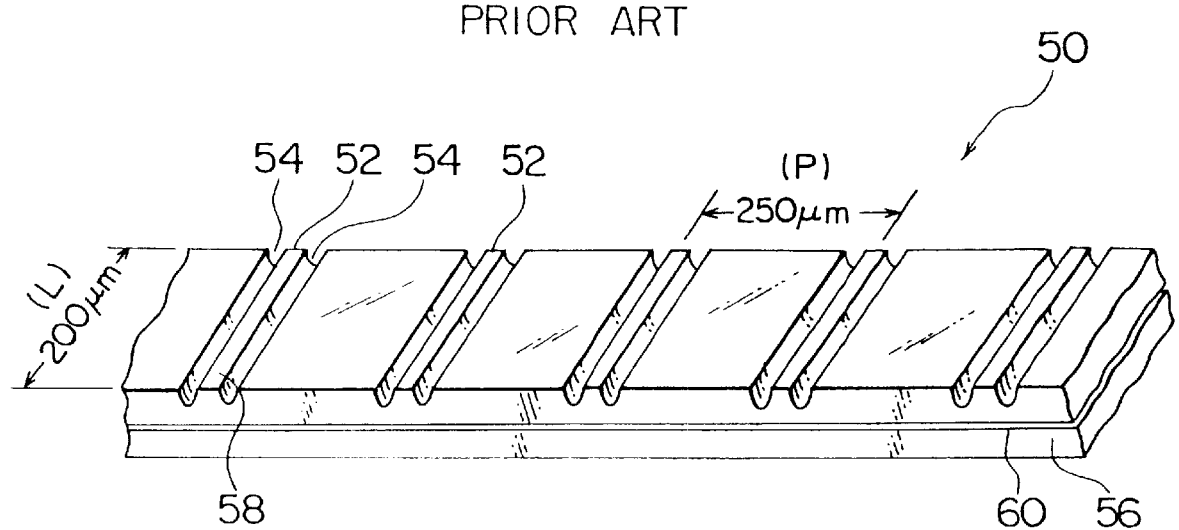
FIG. 1 is a perspective view of a conventional semiconductor laser array.
Figure 2:
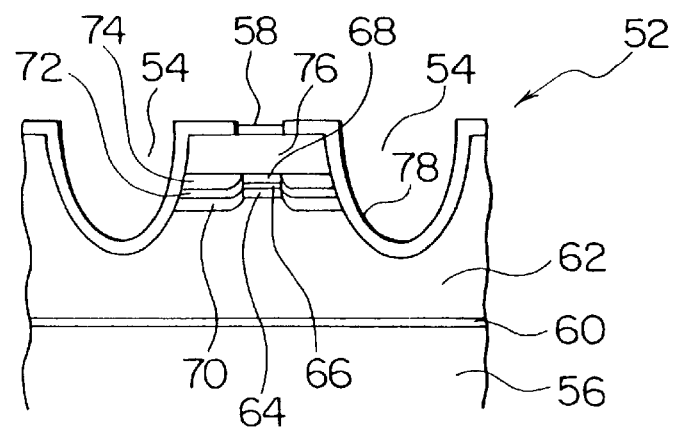
FIG. 2 is a detailed cross-sectional view of a portion of the semiconductor laser array of FIG. 1.
Figure 3:
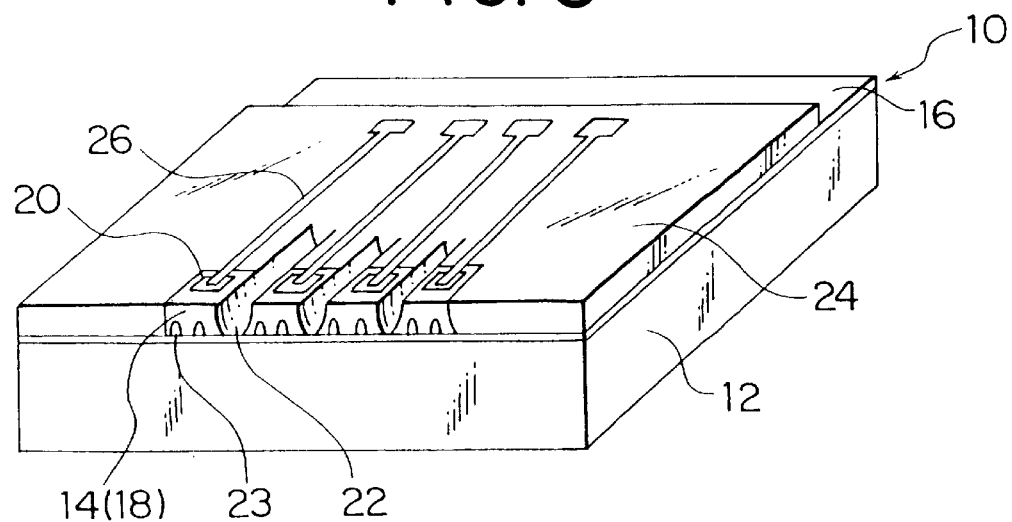
FIG. 3 is a perspective view of a semiconductor laser array according to an embodiment of the present invention.

Referring to FIG. 3, a semiconductor laser array according to a first embodiment of the present invention includes four separate laser devices 14 arranged in an array on a single submount 12 to operate independently of each other. The submount 12 mounts thereon a common electrode layer 16 as a p-side electrode. The laser active sections 18 of the laser devices 14 are electrically separated from each other together with the n-side electrodes 20 by a separation channel 22 having a thickness of 20 to 50 $\mu$m. A p-side contact layer 46 is bonded onto the p-side electrode layer 16 formed on the submount 12 in a junction-down fashion. In this configuration, the individual laser devices 14 can be operated independently of each other. The term "junction-down fashion or junction-down structure " as used herein means a structure wherein the laser active sections formed on a substrate is bonded to the submount so that the top layer of the laser active sections are in direct contact with the submount.

The array of the semiconductor laser devices 14 are surrounded by a resin layer 24 made of a polyimide such as transparent polyimide or polyimide fluoride, which has a high transparency and a low permeability against water. The top surface of the resin layer 24 is flush with the top surface of the laser devices 14. The p-side common electrode 16 appears at the location where the resin layer 24 is removed. Each facet of the laser device is covered or coated by a high reflectance film for improvement of the laser characteristics.

The laser devices 14 are of a so-called BH-LD structure wherein the n-InP substrate 28 is separated by the separation channel 22, and have grooves 23 for reducing parasitic capacitances. A lead wire 26 for each laser device extends on the top surface of the resin layer 24 from the separated n-side electrode 20. The thickness and width of the lead wire 26 are determined so that the characteristic impedance of the lead wire 26 is set at 50$\Omega$.

Figure 4:
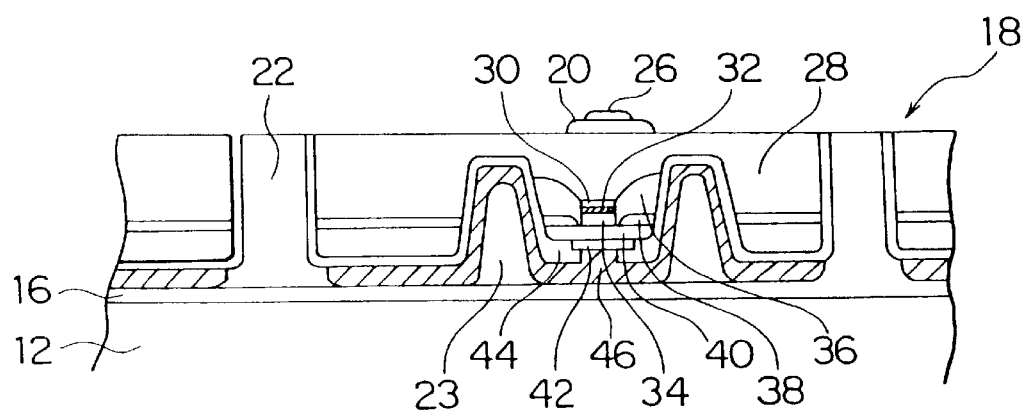
FIG. 4 is a detailed cross-sectional view of a portion of the semiconductor laser array of FIG. 3.

Referring to FIG. 4, the laser active section 18 of the laser device 14 in FIG. 3 is formed on a n-InP substrate 28 before bonding the laser active sections 18 to the submount 12. The laser active section 18 is shown in FIG. 4 as the n-InP substrate 28 being the top of the active section 18 because of the junction-down structure of the laser array. The laser active section 18 has an n-InP cladding layer 30, a strained MQW active layer 32, and a p-InP cladding layer 34 consecutively formed on the n-InP substrate 28. Both the sides of the laser active section 18 are buried by an n-InP burying layer 36 and a p-InP blocking layer 38 consecutively formed on the n-InP substrate 28. A p-InP contact layer 40 and a p-side electrode 42 are formed on top of the laser active section 18, and a passivation layer 44 covers the entire surface except for the p-side electrode 42. A metallic contact layer 46 covers the passivation layer 44 and the exposed surface of the p-side electrode 42 for electrical connection thereto. The laser active sections 18 are bonded onto the common electrode layer 16 on the submount 12 in the junction-down fashion.

In the present embodiment, p-type Zn dopant is not used for the n-InP substrate 28 and accordingly does not re-diffuse to the laser active section 18 to thereby vary or affect the laser characteristics. Further, the p-side electrode 16 is formed as a common electrode layer for the array of the laser devices, which allows high-speed N-P-N transistors to effectively drive the semiconductor laser array. Moreover, the facets of the laser device can be protected by a resin layer without attaching of the resin onto the electrodes of the laser active sections. Furthermore, by using a dielectric material having a low dielectric loss tangent as low as on the order of about $10^{-3}$, a design choice can be achieved wherein a suitable characteristic impedance of the lead wires for signal transmission is selected.

Now, a method for manufacturing a semiconductor laser array according to the present invention will be described with reference to FIG. 5 and FIGS. 6A to 6D by way of the method for forming the semiconductor laser array shown in FIG. 3.

Figure 5:
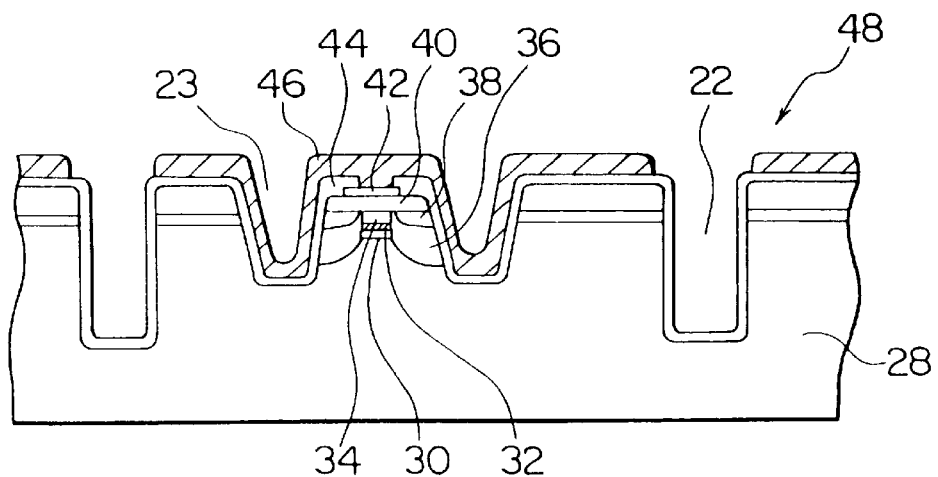
FIG. 5 is a cross-sectional view of a wafer used for manufacturing the semiconductor laser array of FIG. 3.

Referring to FIG. 5, a semiconductor wafer is prepared which has the layer structure shown in FIG. 4, although the wafer of FIG. 5 is shown as top side down. The semiconductor wafer has an array of four laser devices 14 electrically separated from each other by a separation channel 22 and formed on an n-type InP substrate 28.

Figure 6A:
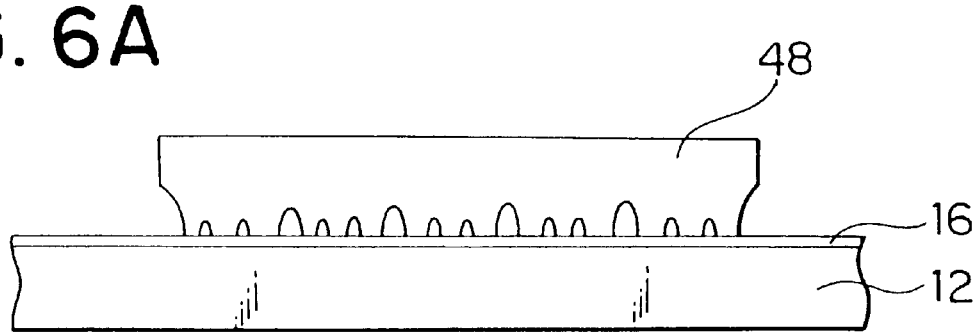
FIGS. 6A to 6D are cross-sectional views of the semiconductor laser array of FIG. 3, consecutively showing the steps of manufacturing the same.
Figure 6B:
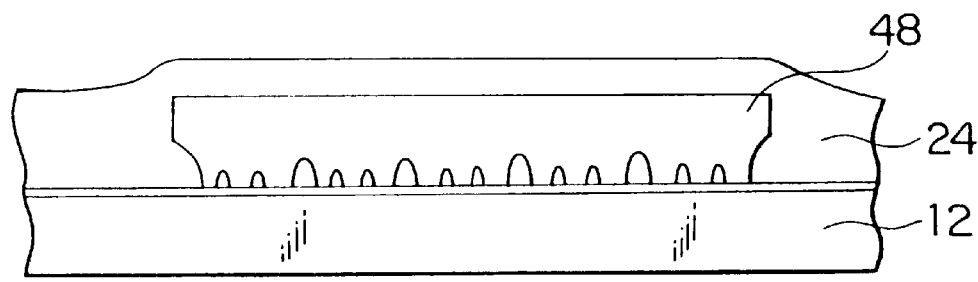

The semiconductor wafer 48 of FIG. 5 is bonded in a junction-down fashion to a submount 12 mounting thereon a common electrode layer 16, to thereby obtain a bonded wafer wherein the contact layer 46 and p-side common layer 16 are bonded together, as shown in FIG. 6A. Next, a high reflection layer not shown in the drawing is formed on either facet of each laser device, followed by application of an insulator resin onto the bonded wafer to a thickness sufficient to entirely cover the laser wafer 48 by the resin layer 24, as shown in FIG. 6B. The resin layer 24 has a high transparency and a low permeability against water. The insulator resin may be selected from polyimides such as transparent polyimide and a polyimide fluoride.

The insulator resin layer 24 functions for alleviating the mechanical impact imposed during the subsequent step of polishing the bonded wafer 48. The insulator resin layer 24 also functions for insulating the lead wires and protecting the laser devices.

Figure 6C:
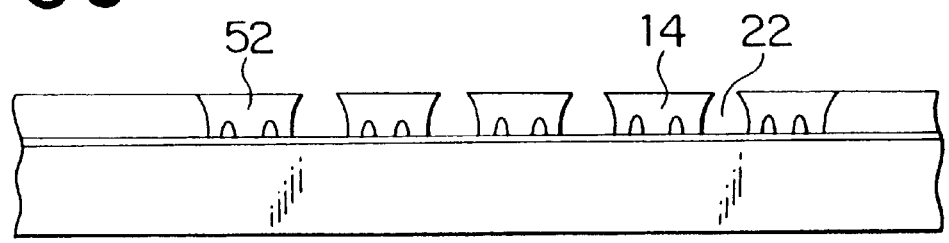
Figure 6D:
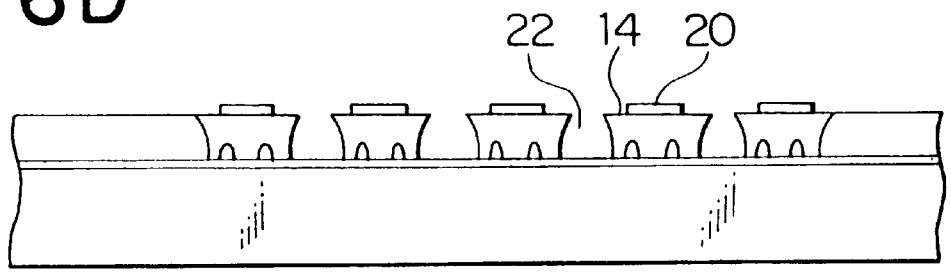

Subsequently, the wafer 48 together with the resin layer 24 on the submount 12 is subjected to a chemical-mechanical polishing (CPM) to polish or grind the laser array wafer 48 to expose the separation channels 22 on the back surface of the wafer 48, as shown in FIG. 6C, thereby electrically separating the individual laser devices from each other.

Thereafter, an n-side electrode 20 is formed on the polished surface of each laser device 52, followed by providing a lead wire on each of the n-side electrode 20 together with a pad (not shown) for the leadwire 20. By selectively removing the resin layer 24, a part of the p-side common electrode layer 16 is exposed, to thereby finish the final structure of the semiconductor laser array 10 of FIG. 3.

Alternatively, the CMP step may be followed by selective removal of the resin layer 24 and a subsequent formation of another resin layer to entirely fill the separation channel 23.

In the method for manufacturing the semiconductor laser array as described heretofore, since it is possible to control the thickness of the epitaxial layer constant along the array of the laser devices, the distance from the top of the submount to the laser active center is maintained constant. The uniform thickness of the epitaxial layers allows each of the optical fibers to be aligned with the center of a corresponding laser device simply by determining the distance between the submount and the active layer, using the top surface of the submount as a reference plane.

Moreover, in the method according to the embodiment, since the facets of the array of the laser devices are coated by high reflectance resin films at a time after mounting the array on the submount, the excess resin of the high reflectance film attached to the electrode can be removed by the CMP step.

The use of the n-type substrate makes the growth steps to be simple compared to the p-type substrate, thereby allowing uniform characteristics in the semiconductor laser devices. The use of the n-side electrode as a signal line allows an N-P-N transistor to drive the laser device at a high speed.

In the above embodiment, a facet emission laser device is exemplarily described. However, the present invention can be applied to a surface emission laser device, as well. In this case, the surface emission laser device formed on the n-type substrate can be a submount, with the p-type layers in common.

Moreover, the step of separating elements by polishing as used in the above embodiment may be replaced by a dry-etching step. In this case, the back surface of the substrate may be uniformly etched by the dry-etching, or may be selectively etched by the dry-etching at the separation channel. In the latter case, the selective dry-etching can be followed by forming electrodes on the back surface before separation of the wafer into individual laser devices, thereby simplifying the fabrication process. Furthermore, the semiconductor laser array may include only a single laser device.

Since the above embodiment is described only for examples, the present invention is not limited to the above embodiment and various modifications or alterations can be easily made therefrom by those skilled in the art without departing from the scope of the present invention.

What is claimed is:

1. A semiconductor laser array comprising a submount, a common electrode layer formed on said submount, and an array of a plurality of laser active sections bonded onto said common electrode layer in a junction-down structure, said laser active sections being electrically separated from each other and each having a laser active layer and an opposing electrode overlying said laser active layer wherein each of said laser active sections is of a buried hetero-junction structure.

2. A semiconductor laser array as defined in claim 1 wherein said common electrode layer and opposing electrode function as a p-side electrode and an n-side electrode, respectively.

3. A semiconductor laser array as defined in claim 2 wherein said array is surrounded by a transparent resin as a whole.

4. A method for manufacturing a semiconductor laser array comprising the steps of forming an array of a plurality of laser active sections on a semiconductor substrate, bonding said array of laser active sections onto a common electrode formed on a submount so that a top of each of said laser active sections is in contact with said common electrode, polishing said array of laser active sections at a back surface of said semiconductor substrate, and forming an opposing electrode on each respective bottom of said laser active sections wherein said polishing step exposes a bottom of separation channels for separating said laser active sections from each other.

5. A method for manufacturing a semiconductor laser array as defined in claim 4 further comprising the step of covering said laser active sections by a resin film between the steps of bonding and polishing.

6. A method for forming a semiconductor laser array as defined in claim 4 further comprising the step of forming a reflective film on each facet of said laser active sections between the steps of bonding and polishing.

* * * * *